(12) United States Patent
Balachandran et al.

(10) Patent No.: US 8,854,057 B2
(45) Date of Patent: *Oct. 7, 2014

(54) SCHEME TO ACHIEVE ROBUSTNESS TO ELECTROMAGNETIC INTERFERENCE IN INERTIAL SENSORS

(75) Inventors: Ganesh Balachandran, Sunnyvale, CA (US); Vladimir Petkov, Mountain View, CA (US)

(73) Assignee: Robert Bosch GmbH, Stuttgart (DE)

( * ) Notice: Subject to any disclaimer, the term of this patent is extended or adjusted under 35 U.S.C. 154(b) by 495 days.

This patent is subject to a terminal disclaimer.

(21) Appl. No.: 13/231,944

(22) Filed: Sep. 13, 2011

(65) Prior Publication Data

US 2013/0063165 A1    Mar. 14, 2013

(51) Int. Cl.
  *G01R 27/26* (2006.01)
  *G01P 15/08* (2006.01)
  *G01D 5/241* (2006.01)
  *G01P 15/125* (2006.01)

(52) U.S. Cl.
  CPC .......... *G01P 15/125* (2013.01); *G01P 15/0802* (2013.01); *G01D 5/2417* (2013.01); *G01R 27/2605* (2013.01)
  USPC ...................................................... 324/672

(58) Field of Classification Search
  USPC ........................................................ 324/672
  See application file for complete search history.

(56) References Cited

U.S. PATENT DOCUMENTS

| 7,477,180 | B2* | 1/2009 | Lin et al. ........................ 341/172 |
| 7,786,738 | B2* | 8/2010 | Lang et al. ..................... 324/686 |
| 8,536,881 | B2* | 9/2013 | Lin et al. ........................ 324/679 |
| 2005/0218911 | A1* | 10/2005 | Denison ......................... 324/661 |
| 2006/0158244 | A1* | 7/2006 | Kejariwal et al. ................. 330/9 |
| 2007/0216477 | A1* | 9/2007 | McConnell .................... 330/10 |
| 2007/0247171 | A1 | 10/2007 | O'Dowd et al. | |

FOREIGN PATENT DOCUMENTS

WO    2009038924 A2    3/2009

* cited by examiner

*Primary Examiner* — Jeff Natalini
(74) *Attorney, Agent, or Firm* — Maginot, Moore & Beck

(57) ABSTRACT

A capacitive sensor system and method resistant to electromagnetic interference is disclosed. The system includes a capacitive core, differential amplifier with inverting and non-inverting inputs, capacitive paths, and chopping system. Core can include inputs and outputs coupled to variable capacitors, and common nodes coupling variable capacitors. Capacitive paths couple core outputs to amplifier inputs. When chopping system is high, one polarity voltage is applied to core inputs, a first core output is coupled to the inverting input and a second core output is coupled to the non-inverting input. When the chopping system is low, opposite polarity voltage is applied to core inputs, and core output to amplifier input couplings are flipped. Capacitive paths can include bond wires. Chopping system can be varied between high and low at frequencies that smear noise away from a frequency band of interest, or that smear noise substantially evenly across a wide frequency range.

19 Claims, 6 Drawing Sheets

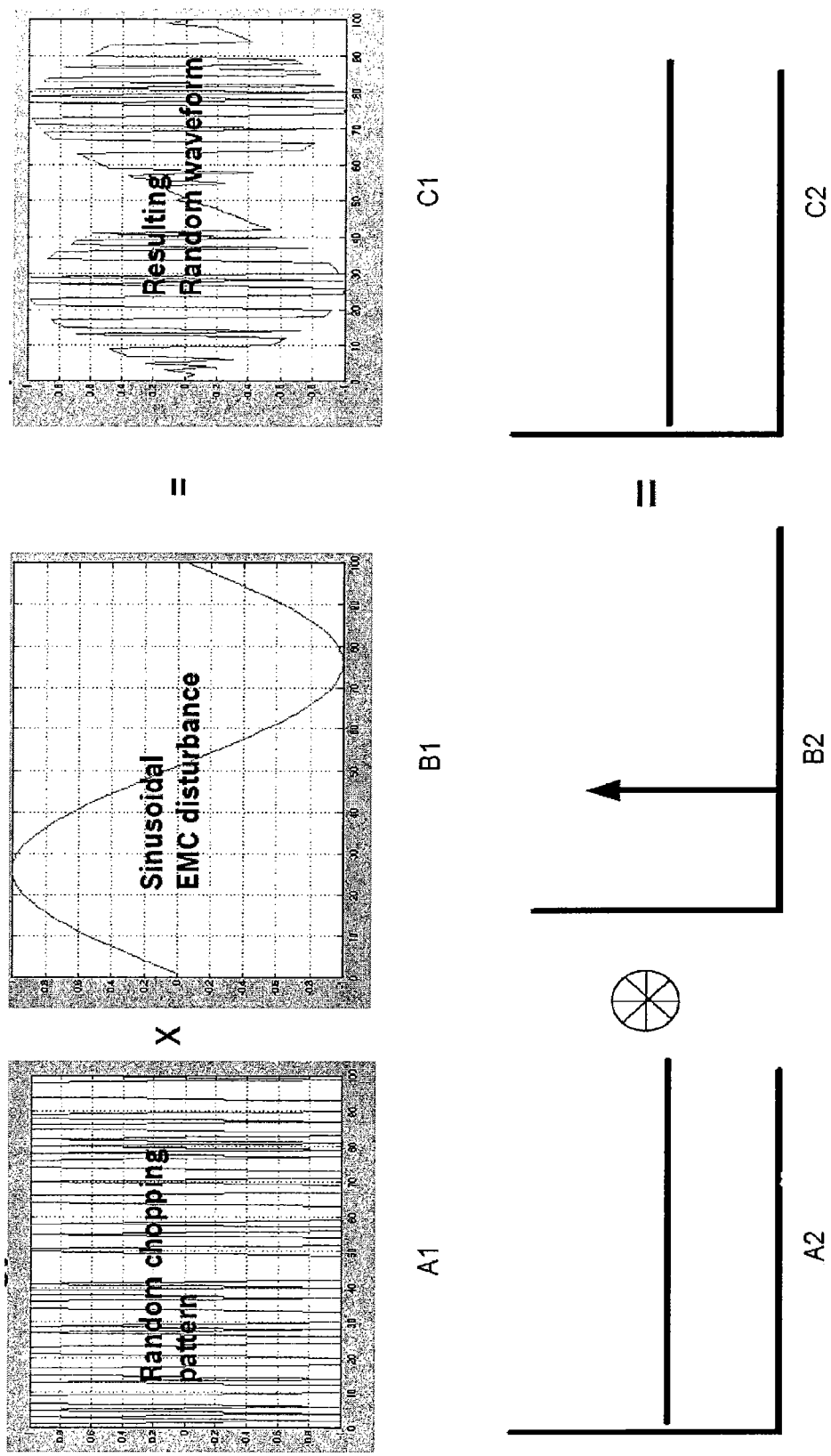

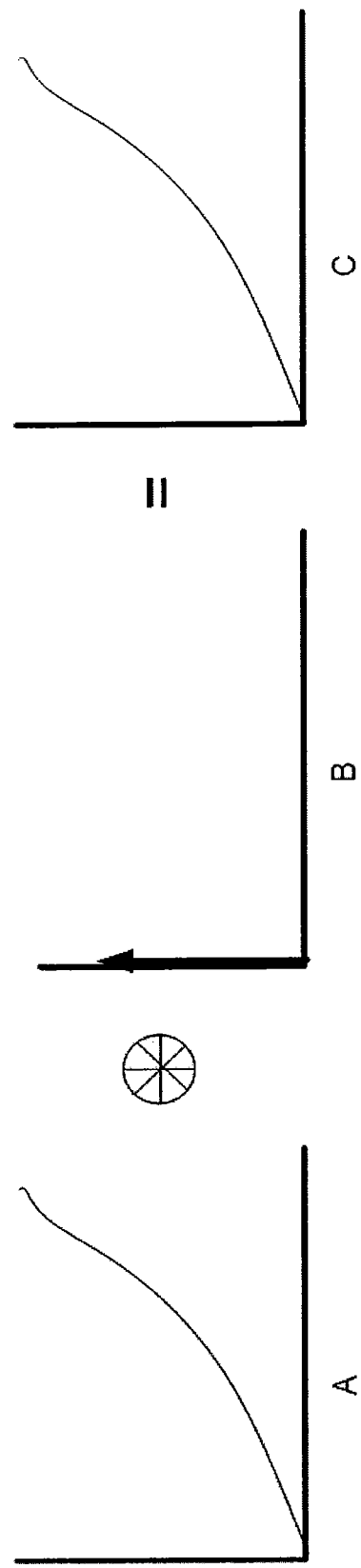

SCHEME TO ACHIEVE ROBUSTNESS TO ELECTROMAGNETIC INTERFERENCE IN INERTIAL SENSORS

BACKGROUND OF THE INVENTION

This patent relates to capacitive transducers, and more particularly to techniques for overcoming electromagnetic interference in capacitive sensors.

In inertial sensors, electromagnetic disturbance or interference (EMI) occurs primarily due to capacitive coupling between bond wires and nearby cables, plates, circuitry, etc. FIG. 1 illustrates an exemplary scenario of EMI. In FIG. 1, a microelectromechanical structure (MEMS) device 102 is coupled to an application specific integrated circuit (ASIC) 104 by a plurality of bond wires 106. A source of EMI 110 that is near the bond wires 106 creates capacitive coupling 110 between the EMI source 110 and the bond wires 106. Capacitor symbols are shown in FIG. 1 to illustrate the capacitive coupling 110, but this simply illustrates the parasitic capacitance between the electromagnetic disturbance source 110 and the bond wires 106, no actual electrical component is present. The bond wires coupling capacitive nodes are the most sensitive to EMI, as opposed to nodes driven by a voltage source or amplifier.

In environments with a high density of electronics, there can be numerous sources of EMI, and these EMI sources can be significant. The electromagnetic disturbances can also occur at substantially a single frequency, which upon sampling can get folded into a DC component. These electromagnetic disturbances can land on top of a desired sensor signal and obliterate the desired signal. For example, if a desired signal is sampled at a 100 kHz clock frequency, and the disturbance is at 100 kHz, then when sampling the disturbance at the clock frequency it can appear as a substantially DC signal. Thus, it is important to protect desired sensor signals, especially along capacitive paths, from EMI. The EMI problem is especially important to solve in safety critical applications that are in harsh environments, for example the sensors used for electronic stability in an automobile.

The two commonly used solutions to EMI are shielding the sensor with metal, and using a differential approach. Shielding the sensor with metal includes creating a Faraday cage to block external electric fields which can cause EMI. However, shielding can be bulky and expensive, especially when there are numerous sensors to be shielded or there is a high density of electronics to be fit in a small area.

The differential approach takes the differences between signals on parallel wires which can substantially subtract out the electromagnetic disturbance as a common mode signal. FIG. 2 illustrates the differential approach. The exemplary differential sensor and amplifier system 200 includes a MEMS device 220 coupled to an ASIC 240 by bond wires 260, 262. Each of the bond wires 260, 262 experiences EMI from external EMI sources 210. There is capacitive coupling 250 between the EMI source 210 and the first bond wire 260 creating a first disturbance capacitance C1, and there is capacitive coupling 252 between the EMI source 210 and the second bond wire 262 creating a second disturbance capacitance C2. If the disturbance capacitances C1 and C2 between the EMI sources 210 and the bond wires 260, 262 are the same, then the electromagnetic disturbance is rejected due to the common mode rejection of the differential amplifier of the ASIC 240. However, in order to achieve the desired cancellation, the disturbance capacitances C1 and C2 between the EMI sources 210 and the bond wires 260, 262 should not be mismatched by more than 0.5%. This matching can be very difficult to achieve in practice. Even if the matching is achieved initially, bond wires can be disturbed or warped, for example by an automobile accident. This movement of the bond wires can cause asymmetry between the bond wires, which can cause an unwanted mismatch in the disturbance capacitances and reduce the effectiveness of the differential approach.

It would be desirable to have a robust technique for reducing electromagnetic interference that also overcomes some of the disadvantages of shielding and differential circuits.

SUMMARY OF THE INVENTION

A capacitive sensor system resistant to electromagnetic interference is disclosed that includes a capacitive core, a differential amplifier, first and second capacitive paths, and a chopping system. The capacitive core includes a first variable capacitor, a second variable capacitor, a first core output coupled to the first variable capacitor, a second core output coupled to the second variable capacitor, and a common node coupling the first variable capacitor and the second variable capacitor. The differential amplifier includes an inverting input and a non-inverting input. The first capacitive path couples the first core output to the inputs of the differential amplifier, and the second capacitive path couples the second core output to the inputs of the differential amplifier. The chopping system has a high state and a low state, and couples the first and second core outputs to the inputs of the differential amplifier. When the chopping system is in the high state, a positive step voltage is applied to the common node of the capacitive core, and the chopping system couples the first core output to the inverting input of the differential amplifier and couples the second core output to the non-inverting input of the differential amplifier. When the chopping system is in the low state, a negative step voltage is applied to the common node of the capacitive core, and the chopping system couples the first core output to the non-inverting input of the differential amplifier and couples the second core output to the inverting input of the differential amplifier. The capacitive core can be a microelectromechanical device. The first capacitive path can include a first bond wire, and the second capacitive path can include a second bond wire. The chopping system can be varied between the high state and the low state at frequencies that smear noise away from a frequency band of interest, or that smear noise substantially evenly across a wide frequency range, or at random frequencies.

A capacitive sensor system resistant to electromagnetic interference is disclosed that includes first and second capacitive cores, a differential amplifier, first and second capacitive paths, and a chopping system. The first capacitive core includes a first variable capacitor, a second variable capacitor, a first core input coupled to the first variable capacitor, a second core input coupled to the second variable capacitor, and a first common node coupling the first variable capacitor and the second variable capacitor. The second capacitive core includes a third variable capacitor, a fourth variable capacitor, a third core input coupled to the third variable capacitor, a fourth core input coupled to the fourth variable capacitor, and a second common node coupling the third variable capacitor and the fourth variable capacitor. The differential amplifier includes an inverting input and a non-inverting input. The first capacitive path couples the first common node and the inputs of the differential amplifier, and the second capacitive path couples the second common node and the inputs of the differential amplifier. The chopping system has a high state and a low state, and couples the first and second common nodes to the inputs of the differential amplifier. When the chopping system is in the high state, a positive reference voltage is applied to the first input of the first capacitive core and to the fourth input of the second capacitive core, a negative reference voltage is applied to the second input of the first capacitive core and to the third input of the second capacitive core, and the chopping system couples the first common node to the inverting input of the differential amplifier and couples the second common node to the non-inverting input of the differential amplifier; the negative reference voltage being substantially the same magnitude and opposite polarity as the positive reference voltage. When the chopping system is in the low state, a negative reference voltage is applied to the first input of the first capacitive core and to the fourth input of the second capacitive core, a positive reference voltage is applied to the second input of the first capacitive core and to the third input of the second capacitive core, and the chopping system couples the first common node to the non-inverting input of the differential amplifier and couples the second common node to the inverting input of the differential amplifier. The first and second capacitive cores can be part of a microelectromechanical device. The first capacitive path can include a first bond wire and the second capacitive path can include a second bond wire. The chopping system can be varied between the high state and the low state at frequencies that smear noise away from a frequency band of interest, or that smear noise substantially evenly across a wide frequency range, or at random frequencies.

A method of making a capacitive sensor system resistant to electromagnetic interference is disclosed. The method includes switchably coupling a first output of a capacitive sensor to inputs of a differential amplifier, switchably coupling a second output of the capacitive sensor to the inputs of the differential amplifier, and flipping a chopping system between a high state and a low state to control electromagnetic interference. In this method, the differential amplifier includes an inverting input and a non-inverting input, and the second output of the capacitive sensor is different from the first output of the capacitive sensor. When the chopping system is in the high state, the method also includes applying a first polarity voltage to an input of the capacitive sensor, coupling the first output of the capacitive sensor to the inverting input of the differential amplifier, and coupling the second output of the capacitive sensor to the non-inverting input of the differential amplifier. When the chopping system is in the low state, the method also includes applying a second polarity voltage to the input of the capacitive sensor, the second polarity voltage having substantially the same magnitude and opposite polarity as the first polarity voltage, coupling the first output of the capacitive sensor to the non-inverting input of the differential amplifier; and coupling the second output of the capacitive sensor to the inverting input of the differential amplifier. The flipping step can include flipping the chopping system between the high state and the low state at frequencies that smear noise away from a frequency band of interest, or that smear noise substantially evenly across a wide frequency range, or at random frequencies.

The method can be done using a capacitive sensor that includes a capacitive core with a first variable capacitor, a second variable capacitor, a first core output coupled to the first variable capacitor, a second core output coupled to the second variable capacitor, and a common node coupling the first variable capacitor and the second variable capacitor. In this case, the first core output is the first output of the capacitive sensor, the second core output is the second output of the capacitive sensor, and the common node is the input of the capacitive sensor. The method can also be done using a capacitive sensor that includes first and second capacitive cores, where the first capacitive core includes a first variable capacitor, a second variable capacitor, a first core input coupled to the first variable capacitor, a second core input coupled to the second variable capacitor, and a first common node coupling the first variable capacitor and the second variable capacitor; and the second capacitive core includes a third variable capacitor, a fourth variable capacitor, a third core input coupled to the third variable capacitor, a fourth core input coupled to the fourth variable capacitor, and a second common node coupling the third variable capacitor and the fourth variable capacitor. In this case, the first output of the capacitive sensor is the first common node of the first capacitive core, the second output of the capacitive sensor is the second common node of the second capacitive core, and the input of the capacitive sensor be any of the first and second core inputs of the first capacitive core and the third and fourth core inputs of the second capacitive core.

BRIEF DESCRIPTION OF THE DRAWINGS

The above mentioned and other features and objects of this invention, and the manner of attaining them, will become more apparent and the invention itself will be better understood by reference to the following description of embodiments of the invention taken in conjunction with the accompanying drawings, wherein:

FIG. 4 shows how a chopping pattern can be used to reduce an electromagnetic disturbance by smearing it across a wide frequency range;

FIG. 6 shows how a shaped chopping pattern can be used to smear the error due to the offset difference in the two chop states away from DC as shaped noise.

Figure 1:
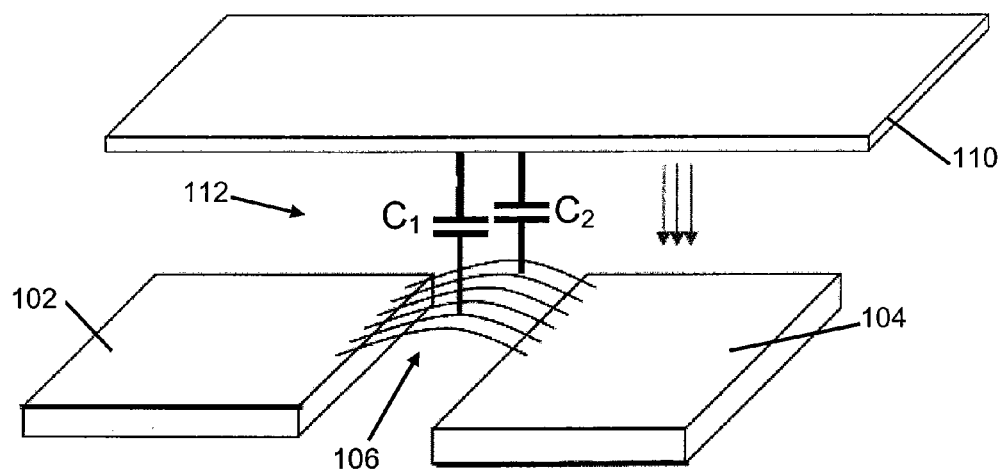
FIG. 1 illustrates electromagnetic disturbance or interference (EMI) due to capacitive coupling between bond wires and nearby cables, plates, circuitry, etc.

Corresponding reference characters indicate corresponding parts throughout the several views. Although the exemplification set out herein illustrates embodiments of the invention, in several forms, the embodiments disclosed below are not intended to be exhaustive or to be construed as limiting the scope of the invention to the precise forms disclosed.

DESCRIPTION OF EXEMPLARY EMBODIMENTS

Figure 3:
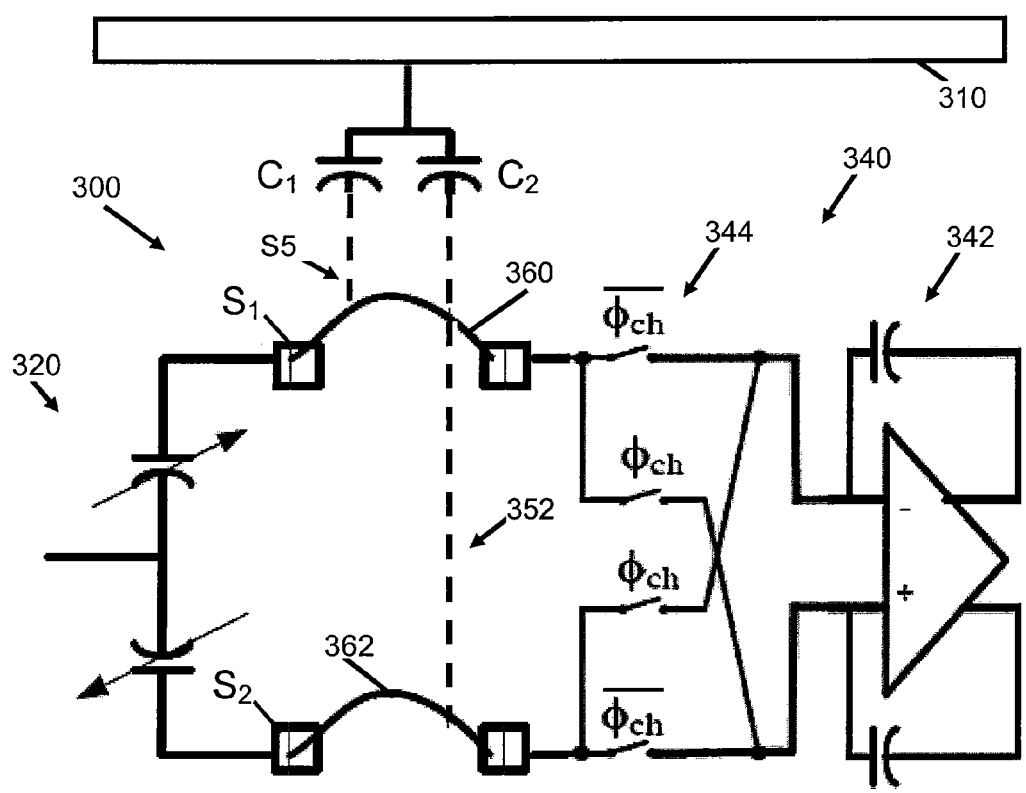
FIG. 3 illustrates an exemplary differential sensor and amplifier system that can implement a robust technique for reducing electromagnetic interference.

FIG. 3 illustrates an exemplary differential sensor and amplifier system 300 that can implement a robust technique for reducing electromagnetic interference that overcomes several disadvantages of shielding and differential circuits. The exemplary differential sensor and amplifier system 300 includes a MEMS device 320 coupled to an ASIC 340 by bond wires 360, 362. The ASIC 340 includes a differential amplifier 342 and a chopping system 344. The first bond wire 360 connects a first output 51 of the MEMS device 320 to one side of the differential amplifier 342, and the second bond wire 362 couples a second output of the MEMS device 320 to the other side of the differential amplifier 342. There can be additional bond wires and connections between the MEMS device 320 and the ASIC 340 but only two are shown for clarity. The ASIC 340 can also include additional circuitry. Each of the bond wires 360, 362 experiences EMI from external EMI sources 310. There is capacitive coupling 350 between the EMI source 310 and the first bond wire 360 creating a first disturbance capacitance C1, and there is capacitive coupling 352 between the EMI source 310 and the second bond wire 362 creating a second disturbance capacitance C2.

Figure 2:
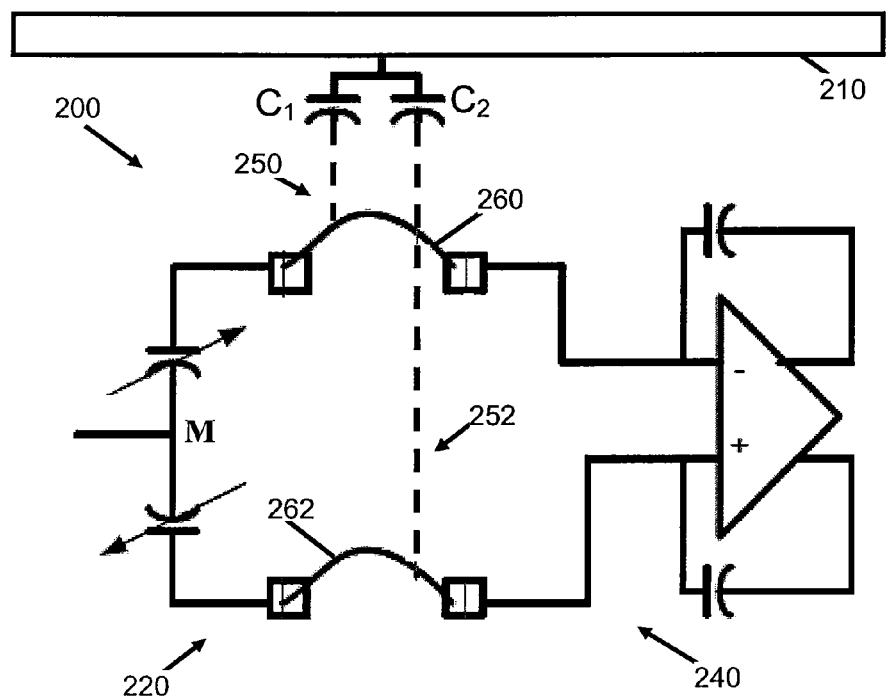
FIG. 2 illustrates a differential approach to overcome electromagnetic disturbances.

The circuit of FIG. 3 is like the circuit of FIG. 2 except that chopping system 344 has been added. The chopping system 344 swaps the connections between outputs S1, S2 of the MEMS device 320 and the inputs of the differential amplifier 342, which in effect flips the bond wires 360, 362. When the chopping signal $\Phi_{ch}$ is in the low state, the switches of the chopping system 344 couple the first output S1 of the MEMS device 320 to the inverting input of the differential amplifier 342, and couple the second output S2 of the MEMS device 320 to the non-inverting input of the differential amplifier 342. During this low phase, a positive step voltage is used to excite the sensor 320 which causes the charge that flows into the amplifier 342 to be:

$$Q_{in} = V_s * (\Delta C_{sensor}) + \Delta V_{emc} * (C1 - C2) \quad (1)$$

where $Q_{in}$ is the charge input to the amplifier 342, Vs is the step voltage that excites the sensor 320, $\Delta C_{sensor}$ is the differential charge of the variable capacitors of the sensor 320, $\Delta V_{emc}$ is the electromagnetic interference between the bond wires 360, 362 and the EMI source 310, and C1 and C2 are the disturbance capacitances.

When the chopping signal $\Phi_{ch}$ is in the high state, the switches of the chopping system 344 couple the second output S2 of the MEMS device 320 to the inverting input of the differential amplifier 342, and couple the first output S1 of the MEMS device 320 to the non-inverting input of the differential amplifier 342. During this high phase, a negative step voltage is used to excite the sensor 320 which causes the charge that flows into the amplifier 342 to be:

$$Q_{in} = (-Vs) * (\Delta C_{sensor}) * (-1) + \Delta V_{emc} * (C2 - C1) \quad (2)$$
$$= Vs * (\Delta C_{sensor}) - \Delta V_{emc} * (C1 - C2)$$

Comparing Eq. (1) and Eq. (2), it can be seen that the first term due to the sensor signal is the same while the second term due to the electromagnetic disturbance reverses sign. Thus, as the chopping signal flips back and forth between low and high states, the desired signal is unchanged but the polarity of the electromagnetic disturbance flips back and forth. By using a pattern for the chopping signal, electromagnetic interference can be smeared across a wide frequency range or smeared away from a particular frequency band.

If we do not know the frequency of the electromagnetic disturbance, a random pattern can be used to smear the electromagnetic disturbance across a wide frequency range. FIG. 4 shows the smearing of the electromagnetic disturbance across a wide frequency range. In FIG. 4, the top plots are in the time domain and the bottom plots are in the frequency domain. FIG. 4A1 shows a random pattern for the chopping signal $\Phi_{ch}$ in the time domain, and FIG. 4A2 shows the random chopping signal spread across a wide range in the frequency domain. The energy of the random chopping pattern is distributed substantially equally across frequencies. FIG. 4B1 shows an exemplary sinusoidal electromagnetic disturbance ($\Delta V_{emc}$) in the time domain, and FIG. 4B2 shows the exemplary electromagnetic disturbance in the frequency domain. The energy of the exemplary electromagnetic disturbance is concentrated at a single frequency. FIG. 4C1 shows the result of combining the random chopping signal with the exemplary electromagnetic disturbance in the time domain, and FIG. 4C2 shows the result of combining these two signals in the frequency domain. The energy of the resulting disturbance signal is smeared substantially equally across a wide frequency range.

This technique can achieve a significant improvement in dealing with electromagnetic disturbances. As shown in FIG. 4, a very large electromagnetic disturbance at a single frequency can be distributed across a wide frequency range. For example, by using a clock frequency of 1 MHz and a desired bandwidth of 50 Hz, this technique provides an improvement in electromagnetic robustness of 10 log(1 MHz/(50 Hz*2)) =40 dB which is a significant benefit.

Figure 5B:
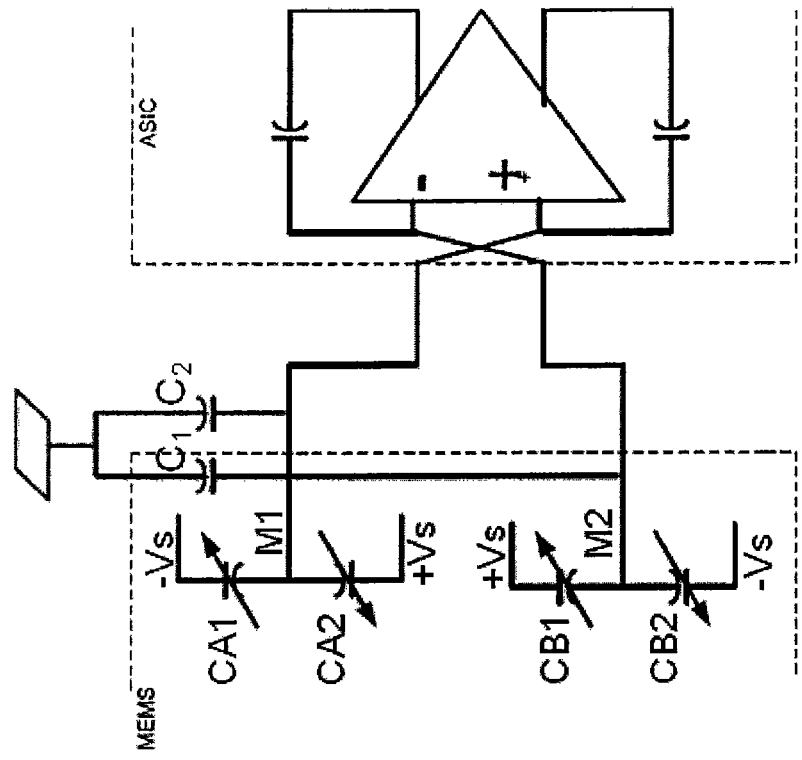
FIG. 5B shows the exemplary full-bridge differential accelerometer of FIG. 5A when the chopping signal is in the high state.
Figure 5A:
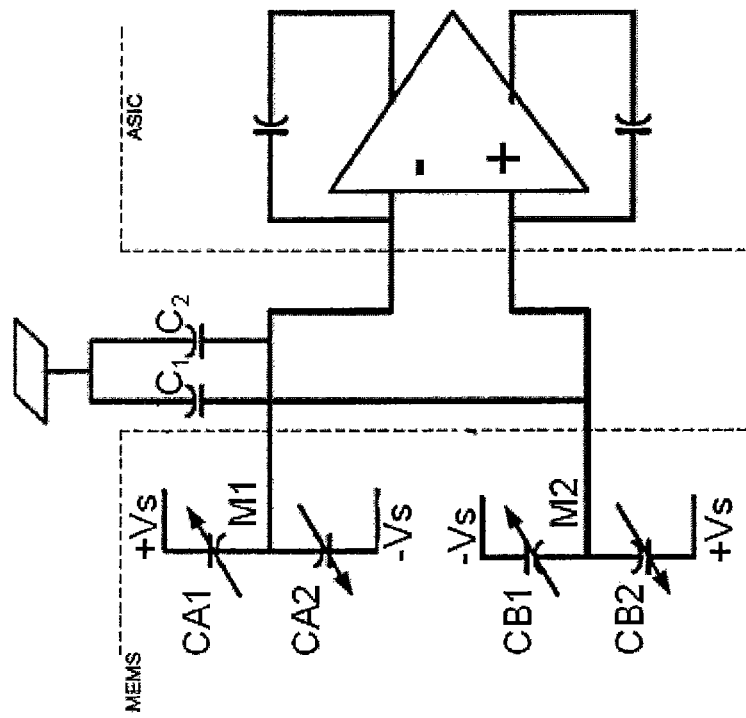
FIG. 5A shows an exemplary full-bridge differential capacitive accelerometer when the chopping signal is in the low state.

This EMI robustness technique can be used in any capacitive sensor, for example, it can be used in gyroscopes, accelerometers, pressure sensors etc. FIG. 3 shows an exemplary half-bridge (two capacitors) capacitive sensor. FIG. 5 shows an exemplary full-bridge (four capacitors) differential capacitive accelerometer. FIG. 5A shows the couplings when the chopping signal is in the low state and FIG. 5B shows the couplings when the chopping signal is in the high state. A switching system like the chopping system 344 of FIG. 3 can be used here, but the couplings in each state are explicitly shown for clarity. Note that it is the capacitive nodes like those between the capacitive core outputs of the MEMS and the amplifier inputs that are affected by the electromagnetic disturbances and capacitive coupling.

In the exemplary embodiment of FIG. 5, the MEMS includes a first capacitive core CA and a second capacitive core CB. The first capacitive core CA includes a first variable capacitor CA1 and a second variable capacitor CA2 that are coupled by a first common node M1. The first capacitive core CA also includes a first input coupled to the first variable capacitor CA1 and a second input coupled to the second variable capacitor CA2. The second capacitive core CB includes a third variable capacitor CB1 and a fourth variable capacitor CB2 that are coupled by a second common node M2. The second capacitive core CB also includes a third input coupled to the third variable capacitor CB1 and a fourth input coupled to the fourth variable capacitor CB2. The first common node M1 of the first capacitive core CA is coupled to an upper MEMS output, and the second common node M2 of the second capacitive core CB is coupled to a lower MEMS output.

In FIG. 5A, when the chopping signal is in the low state, the upper MEMS output is coupled to the inverting input of the ASIC amplifier and the lower MEMS output is coupled to the non-inverting input of the ASIC amplifier. Also when the chopping signal is in the low state, a positive reference voltage +Vs is applied to the first input of the first capacitive core CA and to the fourth input of the second capacitive core CB, and a negative reference voltage −Vs is applied to the second input of the first capacitive core CA and to the third input of the second capacitive core CB. The positive and negative reference voltages having substantially the same magnitude and opposite polarities.

In FIG. 5B, when the chopping signal is in the high state, the MEMS outputs and the reference voltages are flipped. When the chopping signal is in the high state, the upper MEMS output is coupled to the non-inverting input of the ASIC amplifier and the lower MEMS output is coupled to the inverting input of the ASIC amplifier. Also when the chopping signal is in the high state, a negative reference voltage −Vs is applied to the first input of the first capacitive core CA and to the fourth input of the second capacitive core CB, and a positive reference voltage +Vs is applied to the second input of the first capacitive core CA and to the third input of the second capacitive core CB.

The shape of the chopping pattern can be selected to achieve the right compromise between EMI robustness and tolerance to MEMS non-idealities. In some cases, a flat spectrum chopping sequence like that shown in FIG. 4A1 and 4A2 may not be the best choice. For example, if due to sensor non-idealities (for example parasitic capacitances), the offsets in the low and high phases of the chop signal are different, then it may be better to use a shaped chopping sequence. Plain random chopping smears the offset difference as white noise which puts some noise around DC and raises the noise floor. A shaped chopping sequence can be used to smear the noise away from a particular frequency band. For example, if the frequency band of interest is at DC or low frequencies, a shaped chopping sequence can be used that smears the noise to higher frequencies.

FIG. 6 shows how a shaped chopping pattern can be used to smear the error due to the offset difference in the two chop states away from DC as shaped noise. FIG. 6A shows a chopping pattern in the frequency domain. The chopping pattern has substantially no DC or low frequency component and starts ramping up at higher frequencies. FIG. 6B shows the DC error due to the difference in the offsets between the high chop state and the low chop state. FIG. 6C shows the result in the frequency domain of combining the shaped chopping pattern of FIG. 6A with the DC error due to the offset difference of FIG. 6B. The error in output due to the offset difference is shaped as noise away from DC and low frequencies, the frequency band of interest, and into higher frequencies.

Figure 7:
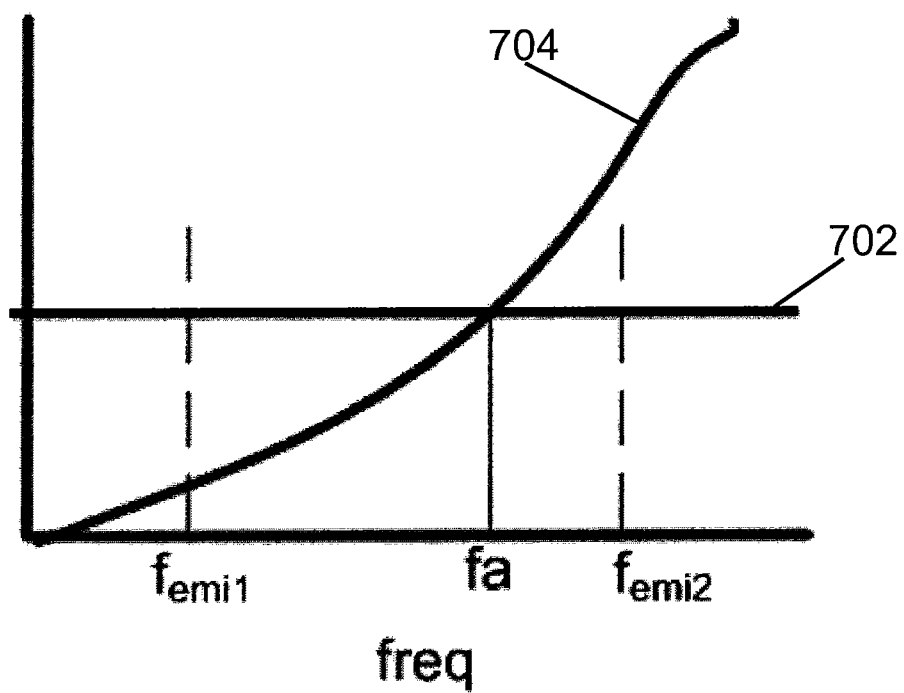
FIG. 7 shows a potential tradeoff between a shaped chopping pattern and an unshaped random pattern.

However, the use of a shaped pattern can result in slightly more EMI induced disturbance for certain EMI frequencies. FIG. 7 illustrates the potential tradeoff between a shaped chopping pattern and an unshaped random pattern. FIG. 7 shows the frequency spectrum of an unshaped random chopping pattern 702 and of an exemplary shaped chopping pattern 704. If the aliased EMI frequency is less than frequency fa, for example at frequency $f_{emi1}$, then the shaped pattern 704 folds less noise onto DC than the unshaped pattern 702. However, if the aliased EMI frequency is greater than frequency fa, for example at frequency $f_{emi2}$, then the unshaped pattern 702 folds less noise onto DC than the shaped pattern 704. System level considerations can be used to decide the desired chopping pattern.

While this invention has been described as having an exemplary design, the present invention may be further modified within the spirit and scope of this disclosure. This application is therefore intended to cover any variations, uses, or adaptations of the invention using its general principles.

We claim:

1. A capacitive sensor system resistant to electromagnetic interference, the capacitive sensor system comprising:
    a capacitive core including a first variable capacitor, a second variable capacitor, a first core output coupled to the first variable capacitor, a second core output coupled to the second variable capacitor, and a common node coupling the first variable capacitor and the second variable capacitor; a differential amplifier including an inverting input and a non-inverting input; a first capacitive path between the first core output and the inputs of the differential amplifier; a second capacitive path between the second core output and the inputs of the differential amplifier;
    a chopping system having a high state and a low state, the chopping system coupling the first and second core outputs to the inputs of the differential amplifier, wherein when the chopping system is in the high state, a positive step voltage is applied to the common node of the capacitive core, and the chopping system couples the first core output to the inverting input of the differential amplifier and couples the second core output to the non-inverting input of the differential amplifier; and
    when the chopping system is in the low state, a negative step voltage is applied to the common node of the capacitive core, and the chopping system couples the first core output to the non-inverting input of the differential amplifier and couples the second core output to the inverting input of the differential amplifier.

2. The capacitive sensor system of claim 1, wherein the capacitive core is a microelectromechanical device.

3. The capacitive sensor system of claim 2, wherein the first capacitive path includes a first bond wire and the second capacitive path includes a second bond wire.

4. The capacitive sensor system of claim 1, wherein the first capacitive path includes a first bond wire and the second capacitive path includes a second bond wire.

5. The capacitive sensor system of claim 1, wherein the chopping system is varied between the high state and the low state at frequencies that smears noise away from a frequency band of interest.

6. The capacitive sensor system of claim 1, wherein the chopping system is varied between the high state and the low state at frequencies that smears noise substantially evenly across a wide frequency range.

7. The capacitive sensor system of claim 6, wherein the chopping system is varied between the high state and the low state at random frequencies.

8. A capacitive sensor system resistant to electromagnetic interference, the capacitive sensor system comprising:
    a first capacitive core including a first variable capacitor, a second variable capacitor, a first core input coupled to the first variable capacitor, a second core input coupled to the second variable capacitor, and a first common node coupling the first variable capacitor and the second variable capacitor; a second capacitive core including a third variable capacitor, a fourth variable capacitor, a third core input coupled to the third variable capacitor, a fourth core input coupled to the fourth variable capacitor, and a second common node coupling the third variable capacitor and the fourth variable capacitor;
    a differential amplifier including an inverting input and a non-inverting input;
    a first capacitive path between the first common node and the inputs of the differential amplifier; a second capacitive path between the second common node and the inputs of the differential amplifier;
    a chopping system having a high state and a low state, the chopping system coupling the first and second common nodes to the inputs of the differential amplifier, wherein when the chopping system is in the high state, a positive reference voltage is applied to the first input of the first capacitive core and to the fourth input of the second capacitive core, a negative reference voltage is applied to the second input of the first capacitive core and to the third input of the second capacitive core, and the chopping system couples the first common node to the inverting input of the differential amplifier and couples the second common node to the non-inverting input of the differential amplifier;

the negative reference voltage being substantially the same magnitude and opposite polarity as the positive reference voltage; and when the chopping system is in the low state, a negative reference voltage is applied to the first input of the first capacitive core and to the fourth input of the second capacitive core, a positive reference voltage is applied to the second input of the first capacitive core and to the third input of the second capacitive core, and the chopping system couples the first common node to the non-inverting input of the differential amplifier and couples the second common node to the inverting input of the differential amplifier.

9. The capacitive sensor system of claim 8, wherein the first and second capacitive cores are part of a microelectromechanical device.

10. The capacitive sensor system of claim 9, wherein the first capacitive path includes a first bond wire and the second capacitive path includes a second bond wire.

11. The capacitive sensor system of claim 8, wherein the first capacitive path includes a first bond wire and the second capacitive path includes a second bond wire.

12. The capacitive sensor system of claim 8, wherein the chopping system is varied between the high state and the low state at frequencies that smears noise away from a frequency band of interest.

13. The capacitive sensor system of claim 8, wherein the chopping system is varied between the high state and the low state at frequencies that smears noise substantially evenly across a wide frequency range.

14. The capacitive sensor system of claim 13, wherein the chopping system is varied between the high state and the low state at random frequencies.

15. A method of making a capacitive sensor system resistant to electromagnetic interference, the method comprising:
switchably coupling a first output of a capacitive sensor to inputs of a differential amplifier, the differential amplifier including an inverting input and a non-inverting input;
switchably coupling a second output of the capacitive sensor to the inputs of the differential amplifier, the second output of the capacitive sensor being different from the first output of the capacitive sensor;
flipping a chopping system between a high state and a low state to control electromagnetic interference, when the chopping system is in the high state:
applying a first polarity voltage to an input of the capacitive sensor, coupling the first output of the capacitive sensor to the inverting input of the differential amplifier;
and coupling the second output of the capacitive sensor to the non-inverting input of the differential amplifier;
and when the chopping system is in the low state, applying a second polarity voltage to the input of the capacitive sensor, the second polarity voltage having substantially the same magnitude and opposite polarity as the first polarity voltage;
coupling the first output of the capacitive sensor to the non-inverting input of the differential amplifier;
coupling the second output of the capacitive sensor to the inverting input of the differential amplifier;
wherein the capacitive sensor comprises a capacitive core including a first variable capacitor, a second variable capacitor, a first core output coupled to the first variable capacitor, a second core output coupled to the second variable capacitor, and a common node coupling the first variable capacitor and the second variable capacitor; and
the first core output being the first output of the capacitive sensor, the second core output being the second output of the capacitive sensor, and the common node being the input of the capacitive sensor.

16. The method of claim 15, wherein the flipping step comprises flipping the chopping system between the high state and the low state at frequencies that smear noise away from a frequency band of interest.

17. The method of claim 15, wherein the flipping step comprises flipping the chopping system between the high state and the low state at frequencies that smear noise substantially evenly across a wide frequency range.

18. The method of claim 17, wherein the flipping step comprises flipping the chopping system between the high state and the low state at random frequencies.

19. The method of claim 15, wherein the capacitive sensor comprises a first capacitive core and a second capacitive core;
the first capacitive core including a first variable capacitor, a second variable capacitor, a first core input coupled to the first variable capacitor, a second core input coupled to the second variable capacitor, and a first common node coupling the first variable capacitor and the second variable capacitor; the second capacitive core including a third variable capacitor, a fourth variable capacitor, a third core input coupled to the third variable capacitor, a fourth core input coupled to the fourth variable capacitor, and a second common node coupling the third variable capacitor and the fourth variable capacitor;
the first output of the capacitive sensor being the first common node of the first capacitive core, the second output of the capacitive sensor being the second common node of the second capacitive core, and the input of the capacitive sensor being any of the first and second core inputs of the first capacitive core and the third and fourth core inputs of the second capacitive core.

* * * * *